(12) United States Patent
Aburakawa et al.

(10) Patent No.: US 11,430,611 B2
(45) Date of Patent: Aug. 30, 2022

(54) THIN FILM CAPACITOR, CIRCUIT BOARD INCORPORATING THE SAME, AND THIN FILM CAPACITOR MANUFACTURING METHOD

(71) Applicant: TDK CORPORATION, Tokyo (JP)

(72) Inventors: Yuuki Aburakawa, Tokyo (JP); Tatsuo Namikawa, Tokyo (JP); Akiyasu Iioka, Tokyo (JP); Atsuo Matsutani, Tokyo (JP); Hitoshi Saita, Tokyo (JP); Kazuhiro Yoshikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/165,229

(22) Filed: Feb. 2, 2021

(65) Prior Publication Data
US 2021/0265116 A1 Aug. 26, 2021

(30) Foreign Application Priority Data

Feb. 20, 2020 (JP) ................. 2020-026806

(51) Int. Cl.
H01G 4/33 (2006.01)
H01G 4/008 (2006.01)
(Continued)

(52) U.S. Cl.
CPC ............. H01G 4/33 (2013.01); H01G 4/008 (2013.01); H01G 4/012 (2013.01); H01G 4/306 (2013.01);
(Continued)

(58) Field of Classification Search
CPC .......... H01G 4/33; H01G 4/008; H01G 4/012; H01G 4/306; H01L 23/49822; H01L 23/642; H01L 24/16; H01L 2224/16227; H01L 2924/15313; H01L 2924/35121; H05K 1/162; H05K 1/185; H05K 2201/0175; H05K 2203/1469
See application file for complete search history.

(56) References Cited

U.S. PATENT DOCUMENTS

2004/0080023 A1* 4/2004 Ueda .................. H01G 4/33
257/532
2007/0141800 A1* 6/2007 Kurihara ............. H01L 24/05
257/E23.079
(Continued)

FOREIGN PATENT DOCUMENTS

JP 2018-206839 A 12/2018

Primary Examiner — David M Sinclair
Assistant Examiner — Daniel M Dubuisson
(74) Attorney, Agent, or Firm — Young Law Firm, P.C.

(57) ABSTRACT

Disclosed herein a thin film capacitor that includes a lower electrode layer, an upper electrode layer, and a dielectric layer disposed between the lower electrode layer and the upper electrode layer. The dielectric layer has a through hole. The upper electrode layer has a connection part connected to the lower electrode layer through the through hole and an electrode part insulated from the connection part by a slit. A surface of the lower electrode layer that contacts the connection part through the through hole includes an annular area positioned along an inner wall surface of the through hole and a center area surrounded by the annular area. The annular area is lower in surface roughness than the center area.

8 Claims, 6 Drawing Sheets

(51) Int. Cl.
*H01G 4/012* (2006.01)
*H01G 4/30* (2006.01)
*H01L 23/498* (2006.01)
*H01L 23/64* (2006.01)
*H05K 1/16* (2006.01)

(52) U.S. Cl.
CPC ...... *H01L 23/49822* (2013.01); *H01L 23/642* (2013.01); *H05K 1/162* (2013.01)

(56) References Cited

U.S. PATENT DOCUMENTS

| | | | |
|---|---|---|---|
| 2010/0078813 A1* | 4/2010 | Okayama | H01L 24/11 257/738 |
| 2010/0246092 A1* | 9/2010 | Shibue | H01L 28/40 361/313 |
| 2012/0153463 A1* | 6/2012 | Maeda | H05K 3/0035 174/262 |
| 2016/0027579 A1* | 1/2016 | Kurachi | H01G 4/224 361/321.1 |
| 2020/0152565 A1* | 5/2020 | Choi | H01L 23/49816 |

\* cited by examiner

THIN FILM CAPACITOR, CIRCUIT BOARD INCORPORATING THE SAME, AND THIN FILM CAPACITOR MANUFACTURING METHOD

BACKGROUND OF THE INVENTION

Field of the Invention

The present invention relates to a thin film capacitor and a circuit board incorporating the same and, more particularly, to a thin film capacitor in which a lower electrode layer and a part of an upper electrode layer are connected through a through hole formed in a dielectric layer and a circuit board incorporating such a thin film capacitor. The present invention also relates to a manufacturing method for such a thin film capacitor.

Description of Related Art

Thin film capacitors have a structure in which a lower electrode layer and an upper electrode layer are connected through a dielectric layer as described in JP 2018-206839A. A thin film capacitor described in JP 2018-206839A has two isolated lower electrode layers, one of which is connected to an upper electrode layer.

The thin film capacitor described in JP 2018-206839A includes a part of the lower electrode layer that is not covered with the dielectric layer and, accordingly, results in an insufficient capacitance. To solve this, a configuration is conceivable in which the lower electrode layer and a part of the upper electrode layer are connected through a through hole formed in the dielectric layer. With this configuration, most of the lower electrode layer is covered with the dielectric layer, allowing a larger capacitance to be obtained.

However, in the case where the through hole is formed in the dielectric layer, the surface of the lower electrode layer that is exposed to the through hole contacts a part (connection part) of the upper electrode layer, which may provide insufficient adhesion between the lower and upper electrode layers at this portion. Such insufficient adhesion is particularly noticeable when the lower electrode layer is made of Ni.

Roughening the surface of the lower electrode layer that is exposed to the through hole is effective to solve such a disadvantage; however, the roughening of the lower electrode layer may bring about local stress concentration on the edge of the through hole when the thin film capacitor is embedded using a roll laminator or other means, which can result in cracks or peeling in the dielectric layer.

SUMMARY

It is therefore an object of the present invention to provide a thin film capacitor in which a lower electrode layer and a part of an upper electrode layer are connected to each other through a through hole formed in a dielectric layer and a circuit board incorporating such a thin film capacitor, capable of increasing reliability in a mounted state while achieving sufficient adhesion between the lower and upper electrode layers. Another object of the present invention is to provide a manufacturing method for a thin film capacitor having such a feature.

A thin film capacitor according to the present invention includes a lower electrode layer, an upper electrode layer, and a dielectric layer disposed between the lower electrode layer and the upper electrode layer. The dielectric layer has a through hole. The upper electrode layer has a connection part connected to the lower electrode layer through the through hole and an electrode part insulated from the connection part by a slit. The surface of the lower electrode layer that contacts the connection part through the through hole includes an annular area positioned along the inner wall surface of the through hole and a center area surrounded by the annular area, and the annular area is lower in surface roughness than the center area. A circuit board according to the present invention incorporates the above thin film capacitor.

According to the present invention, the center area, which constitutes a part of the surface of the lower electrode layer that contacts the connection part, is high in surface roughness, allowing enhancement of adhesion between the lower and upper electrode layers. On the other hand, the annular area, which constitutes the remaining part of the surface of the lower electrode layer that contacts the connection part, is low in surface roughness and, therefore, the edge of the through hole is less apt to suffer local stress, hardly allowing cracks or peeling to occur in the dielectric layer in the process of mounting the thin film capacitor in the circuit board.

In the present invention, the surface roughness of the annular area may be 0.1 nm or more and 3 nm or less, and the surface roughness of the center area may be larger than 3 nm and 50 nm or less. The width of the annular area may be 0.1 μm or more and 10 μm or less. This makes it possible to increase reliability while achieving sufficient adhesion between the lower and upper electrode layers.

In the present invention, the lower electrode layer may be made of Ni. Although Ni is low in adhesion and high in Young's modulus, the present invention provides both sufficient reliability and adhesion.

A thin film capacitor manufacturing method according to the present invention includes: a first step of forming a dielectric layer on the surface of a lower electrode layer; a second step of forming a through hole in the dielectric layer; a third step of forming an upper electrode layer on the surface of the dielectric layer; and a fourth step of forming a slit in the upper electrode layer to form a connection part connected to the lower electrode layer through the through hole and an electrode part insulated from the connection part by the slit. The second step is performed by wet-etching such that an annular part, which constitutes a part of the surface of the lower electrode layer that is exposed to the through hole and positioned along the inner wall surface of the through hole is lower in surface roughness than a center area surrounded by the annular area.

According to the present invention, the dielectric layer is wet-etched such that the annular area is lower in surface roughness than the center area, so that it is possible to manufacture a thin film capacitor capable of achieving both sufficient adhesion and reliability.

In the present invention, the second step may include a first wet-etching step of wet-etching the dielectric layer through a first mask having a diameter smaller than the diameter of the through hole to expose the center area and a second wet-etching step of wet-etching the dielectric layer through a second mask having a diameter larger than that of the first mask to expose the annular area. With this method, it is possible to reliably form the annular area having a low surface roughness and the center area having a high surface roughness.

Alternatively, the second step may be performed by wet etching the dielectric layer through a mask having a diameter smaller than the diameter of the through hole to expose the center area overlapping an opening of the mask and the annular area covered with the mask. With this method, it is possible to form the annular area having a low surface roughness and the center area having a high surface roughness by way of a small number of processes.

As described above, according to the present invention, there can be provided a thin film capacitor in which a lower electrode layer and a part of an upper electrode layer are connected to each other through a through hole formed in a dielectric layer and a circuit board incorporating such a thin film capacitor, capable of increasing reliability in a mounted state while achieving sufficient adhesion between the lower and upper electrode layers. Further, according to the present invention, there can be provided a manufacturing method for a thin film capacitor having such a feature.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Hereinafter, a preferred embodiment of the present invention will be described in detail with reference to the accompanying drawings.

Figure 1:
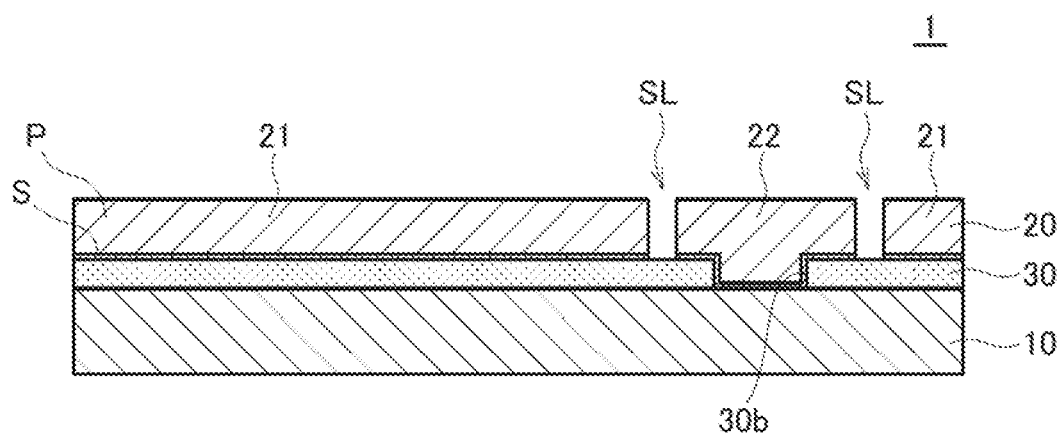
FIG. 1 is a schematic cross-sectional view for explaining the structure of a thin film capacitor 1 according to an embodiment of the present invention.

FIG. 1 is a schematic cross-sectional view for explaining the structure of a thin film capacitor 1 according to an embodiment of the present invention.

As illustrated in FIG. 1, the thin film capacitor 1 according to the present embodiment includes a lower electrode layer 10, an upper electrode layer 20, and a dielectric layer 30 disposed between the lower electrode layer 10 and the upper electrode layer 20. The lower electrode layer 10 serves as a base for the thin film capacitor 1 and is made of, e.g., Ni (nickel). The reason that Ni is used as the material of the lower electrode layer 10 is that, as described later, the lower electrode layer 10 is used as a support body for the dielectric layer 30 in a process of baking the dielectric layer 30 and thus needs to have high temperature durability. The upper electrode layer 20 is made of, e.g., Cu (copper) and composed of a laminated film of a seed layer S and an electrolytic plating layer P.

The dielectric layer 30 is formed using a perovskite dielectric material. Examples of the perovskite dielectric material include: a ferroelectric or dielectric material having a perovskite structure such as $BaTiO_3$ (barium titanate), $(Ba_{1-x}S_x)TiO_3$ (barium strontium titanate), $(Ba_{1-x}Ca_x)TiO_3$, $PbTiO_3$, and $Pb(Zr_xTi_{1-x})O_3$; a complex perovskite relaxer ferroelectric material represented by, e.g., $Pb(Mg_{1/3}Nb_{2/3})O_3$; a bismuth layered compound represented by, e.g., $Bi_4Ti_3O_{12}$ and $SrBi_2Ta_2O_9$; and tungsten bronze ferroelectric material represented by, e.g., $(Sr_{1-x}Ba_x)Nb_2O_6$ and $PbNb_2O_6$. Meanwhile, a ratio of A site and B site in the perovskite structure, perovskite relaxer ferroelectric material, bismuth layered compound, and tungsten bronze ferroelectric material is typically an integral ratio; however, it is allowable to intentionally depart the ratio from the integral ratio to improve the characteristics. An additive can be appropriately added to the dielectric layer 30 as an accessory component to control the characteristics of the dielectric layer 30. The thickness of the dielectric layer 30 is, e.g., 10 nm to 1000 nm.

The upper electrode layer 20 has a ring-shaped slit SL formed therein and is divided thereby into an electrode part 21 and a connection part 22. The electrode part 21 functions as one capacitance electrode of the thin film capacitor 1 and faces, through the dielectric layer 30, the lower electrode layer 10 that functions as the other capacitance electrode of the thin film capacitor 1. The connection part 22 is connected to the lower electrode layer 10 through a through hole 30b formed in the dielectric layer 30 and thus has the same potential as the lower electrode layer 10. With this structure, electrical connection to the lower electrode layer 10 can be made from the upper electrode layer 20 side. In addition, since most part of the lower electrode layer 10 faces the electrode part 21 through the dielectric layer 30, a large capacitance can be obtained.

Figure 2:
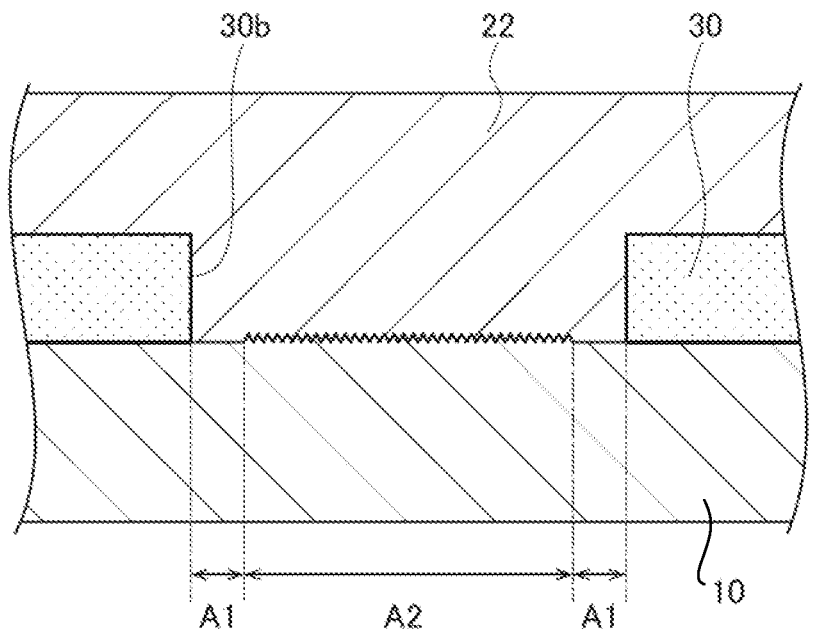
FIG. 2 is a schematic cross-sectional view illustrating a contact portion between the connection part 22 and the lower electrode layer 10 in an enlarged manner.

FIG. 2 is a schematic cross-sectional view illustrating a contact portion between the connection part 22 and the lower electrode layer 10 in an enlarged manner.

As illustrated in FIG. 2, the surface of the lower electrode layer 10 that contacts the connection part 22 through the through hole 30b includes an annular area A1 positioned along the inner wall surface (edge) of the through hole 30b and a center area A2 surrounded by the annular area A1. The annular area A1 has comparatively high flatness, while the center area A2 is roughened. That is, the annular area A1 is lower in surface roughness than the center area A2. Roughening the center area A2 enhances adhesion between the lower electrode layer 10 made of, e.g., Ni and the upper electrode layer 20 made of, e.g., Cu, and making the annular area A1 comparatively flat hardly causes local stress on the edge of the through hole 30b.

Figure 3:
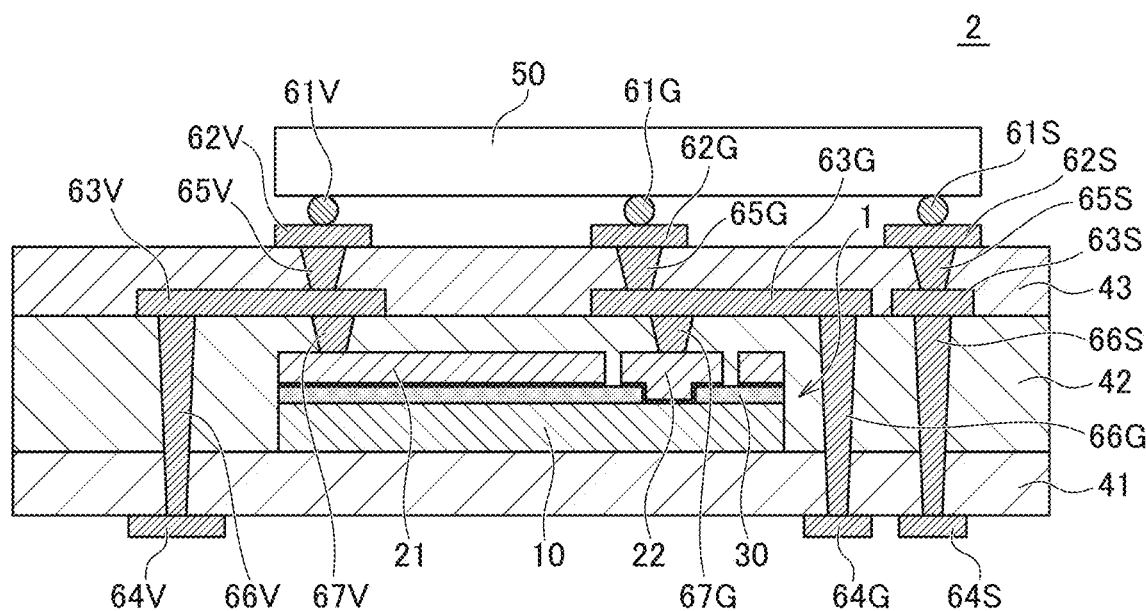
FIG. 3 is a schematic cross-sectional view of a circuit board 2 incorporating the thin film capacitor 1.

FIG. 3 is a schematic cross-sectional view of a circuit board 2 incorporating the thin film capacitor 1 according to the present embodiment.

In the circuit board 2 illustrated in FIG. 3, a plurality of insulating resin layers 41 to 43 are laminated, and the thin film capacitor 1 is embedded in the insulating resin layer 42. A semiconductor chip 50 is mounted on the upper surface of the circuit board 2. Further, the circuit board 2 is provided with power supply patterns 62V to 64V, ground patterns 62G to 64G, and signal patterns 62S to 64S. The power supply pattern 64V, ground pattern 64G, and signal pattern 64S each constitute an external terminal provided on the lower surface of the circuit board 2. The semiconductor chip 50, which is not particularly limited in type, has at least a power supply terminal 61V, a ground terminal 61G, and a signal terminal 61S. The terminals 61V, 61G, and 61S are connected to the power supply pattern 62V, ground pattern 62G, and signal pattern 62S, respectively.

The power supply pattern 62V is connected to the power supply pattern 63V through a via conductor 65V. The power supply pattern 63V is connected to the power supply pattern 64V through a via conductor 66V and to the electrode part 21 of the thin film capacitor 1 through a via conductor 67V. The ground pattern 62G is connected to the ground pattern 63G through a via conductor 65G. The ground pattern 63G is connected to the ground pattern 64G through a via conductor 66G and to the connection part 22 of the thin film capacitor 1 through a via conductor 67G.

With the above configuration, a power supply potential is given to one capacitance electrode (electrode part 21 of the upper electrode layer 20) of the thin film capacitor 1, and a ground potential is given to the other capacitance electrode (lower electrode layer 10), whereby a decoupling capacitor for the semiconductor chip 50 is constituted.

The signal pattern 62S is connected to the signal pattern 63S through a via conductor 65S. The signal pattern 63S is connected to the signal pattern 64S through a via conductor 66S.

Figure 4:
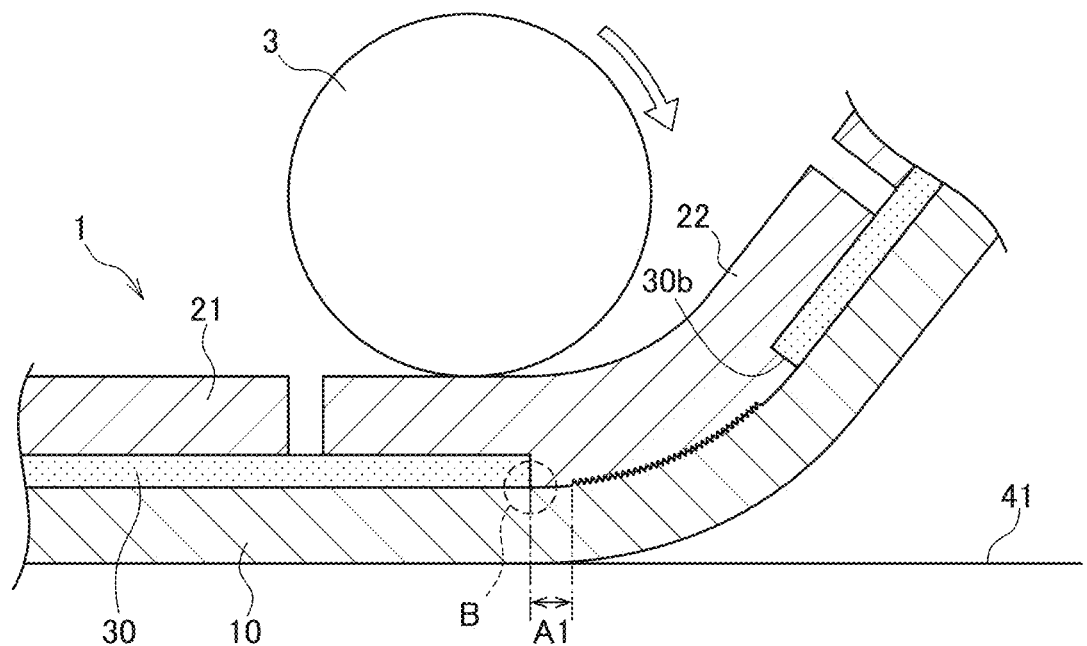
FIG. 4 is an enlarged schematic cross-sectional view for explaining a process of embedding the thin film capacitor 1 in the circuit board 2.

The thin film capacitor 1 can be embedded in the circuit board 2 using a roll laminator. Specifically, as illustrated in FIG. 4, which is a schematic enlarged cross-sectional view, after formation of the insulating resin layer 41, the thin film capacitor 1 is laminated on the surface of the insulating resin layer 41 while rotating a roll 3. In mounting the thin film capacitor 1 using the roll laminator, a bending stress is applied to the thin film capacitor 1 at a portion where the weight of the roll 3 is applied. At this time, a highest stress is applied to an area denoted by symbol B, i.e., an area where the lower electrode layer 10, upper electrode layer 20, and dielectric layer 30 are in contact with one another, which may cause cracks or peeling in the dielectric layer 30 in some cases. Such a phenomenon is particularly noticeable when there is a large difference in Young's modulus between the lower electrode layer 10 and the upper electrode layer 20.

However, in the thin film capacitor 1 according to the present embodiment, the surface roughness of the annular area A1 of the lower electrode layer 10 is reduced, which hardly allows generation of local stress concentration. Therefore, cracks or peeling is less liable to occur in the dielectric layer 30 in the process of embedding the thin film capacitor in the circuit board 2 and hence product reliability increases. Further, the center area A2 of the lower electrode layer 10 that is away from the inner wall surface of the through hole 30b is roughened, allowing enhancement of adhesion between the lower electrode layer 10 and the upper electrode layer 20.

To prevent cracks or peeling in the dielectric layer 30, the surface roughness of the annular area A1 is preferably set to 0.1 nm or more and 3 nm or less, and the width thereof is preferably set to 0.1 μm or more and 10 μm or less. To sufficiently enhance adhesion between the lower electrode layer 10 and the upper electrode layer 20, the surface roughness of the center area A2 is preferably set to larger than 3 nm and 50 nm or less, and the area of the center area A2 is preferably larger than that of the annular area A1.

The following describes a manufacturing method for the thin film capacitor 1 according to the present embodiment.

FIGS. 5 to 10A and 10B are process views for explaining a manufacturing method for the thin film capacitor 1 according to the present embodiment.

Figure 5:
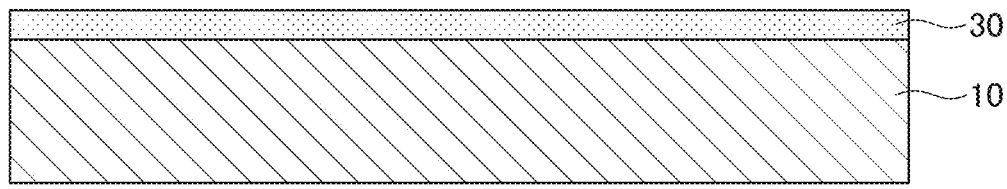
FIGS. 5 to 8 are process views for explaining a manufacturing method for the thin film capacitor 1.
Figure 6:
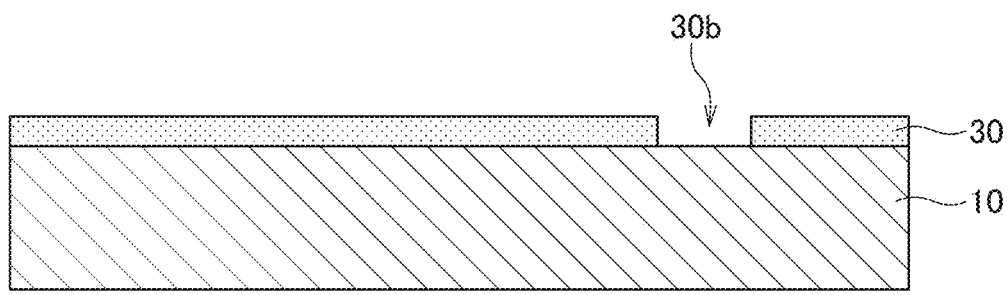

As illustrated in FIG. 5, the lower electrode layer 10 made of Ni and having a thickness of about 15 μm is prepared, and the dielectric layer 30 made of, e.g., barium titanate is formed on the surface of the lower electrode layer 10 and baked. Although the lower electrode layer 10 is subjected to high temperature at this time, it can endure the baking temperature due to being made of high-melting point metal such as Ni. Then, as illustrated in FIG. 6, the dielectric layer 30 is patterned to form the through hole 30b therein. The surface of the lower electrode layer 10 is exposed at the formation area of the through hole 30b.

Figure 9:
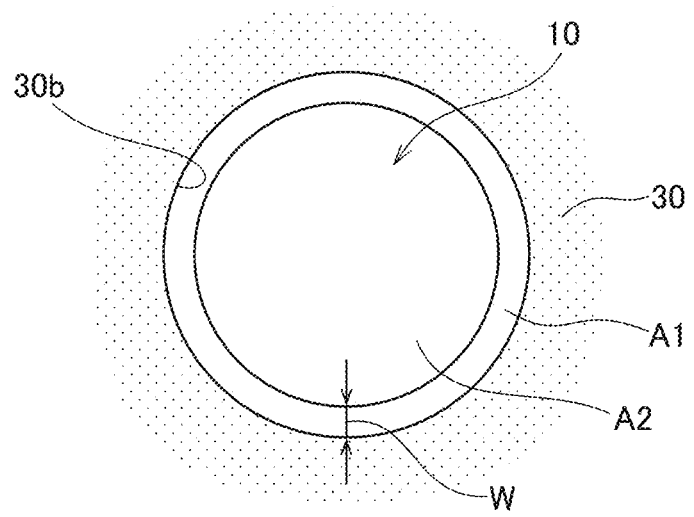
FIG. 9 is a plan view of the through hole 30b.

FIG. 9 is a plan view of the through hole 30b. In the example of FIG. 9, the through hole 30b has a circular planar shape, and the surface of the lower electrode layer 10 that is exposed through the through hole 30b includes the annular area A1 having a width of W and positioned along the inner wall surface of the through hole 30b and the center area A2 surrounded by the annular area A1. As described above, the annular area A1 is lower in surface roughness than the center area A2. There is no particular restriction on the method of forming the annular area A1 and center area A2 having such characteristics, and they can be formed as follows, for example.

Figure 10A:
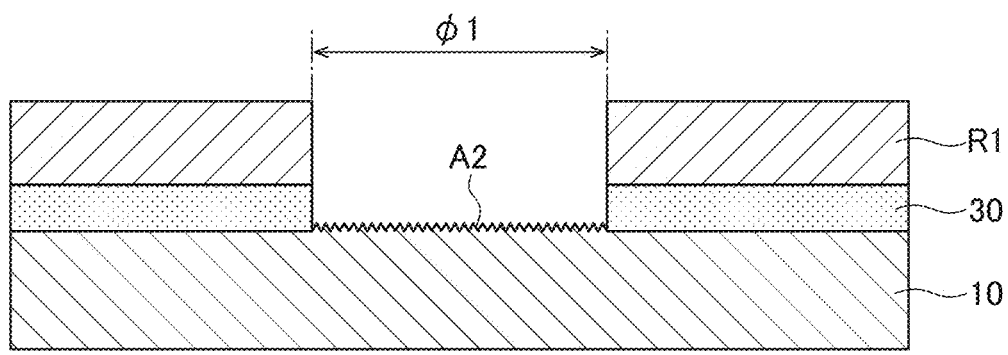
FIGS. 10A and 10B are process views for explaining a first process of forming an annular area A1 and a center area A2.

As illustrated in FIG. 10A, a mask R1 having an opening with a diameter of $\phi 1$ is formed on the surface of the dielectric layer 30, and then the dielectric layer 30 is wet-etched through the mask R1. The diameter $\phi 1$ of the opening of the mask R1 is designed smaller than the diameter of the through hole 30b to be finally formed. A usable etchant is a mixed solution of ammonium fluoride and hydrochloric acid. At this time, the composition and temperature of the etchant, etching time, a supply method of the etchant, and other conditions are adjusted so as to set the etching rate for the lower electrode layer 10 comparatively high. As a result, the surface of the lower electrode layer 10 that is exposed through the dielectric layer 30 has a high surface roughness. The part having a high surface roughness corresponds to the center area A2.

Figure 10B:
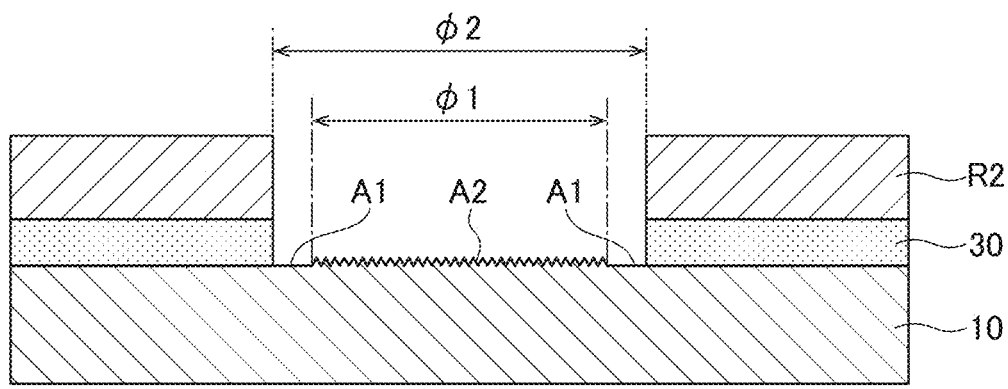

Then, as illustrated in FIG. 10B, after removal of the mask R1, a mask R2 having an opening with a diameter of $\phi 2$ is formed on the surface of the dielectric layer 30, and the dielectric layer 30 is wet-etched once again through the mask R2. The diameter $\phi 2$ of the opening of the mask R2 is designed larger than the diameter $\phi 1$ of the opening of the mask R1 and substantially the same as or slightly smaller than the diameter of the through hole 30b to be finally formed. A usable etchant is a mixed solution of ammonium fluoride and hydrochloric acid. At this time, the composition and temperature of the etchant, etching time, a supply method of the etchant, and other conditions are adjusted so as to set the etching rate for the lower electrode layer 10 as low as possible. As a result, the surface of the lower electrode layer 10 that is newly exposed this time through the dielectric layer 30 has a low surface roughness. The part having a low surface roughness corresponds to the annular area A1.

As described above, by performing the two-stage wet etching using the different masks R1 and R2, it is possible to reliably form the annular area A1 having a low surface roughness and the center area A2 having a high surface roughness.

Figure 11:
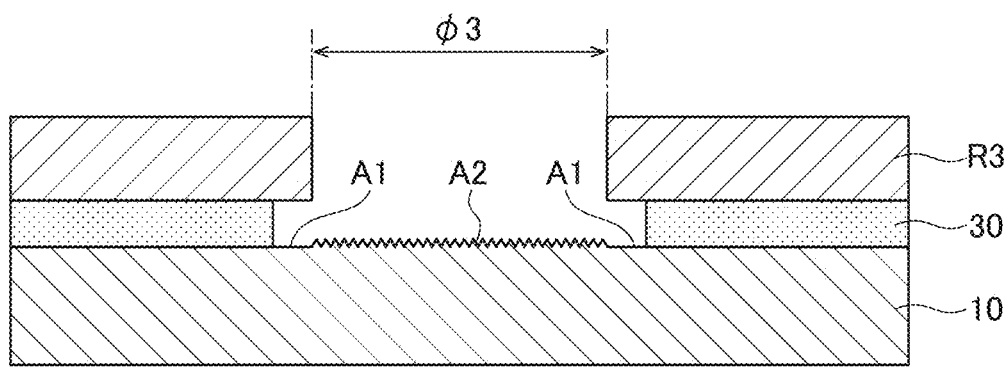
FIG. 11 is a process view for explaining a second process of forming the annular area A1 and the center area A2.

Alternatively, as illustrated in FIG. 11, a mask R3 having an opening with a diameter of $\phi 3$ is formed on the surface of the dielectric layer 30, and the dielectric layer 30 is wet-etched through the mask R3. The diameter φ3 of the opening of the mask R3 is designed smaller than the diameter of the through hole 30b to be finally formed. A usable etchant is a mixed solution of ammonium fluoride and hydrochloric acid. At this time, the composition and temperature of the etchant, a supply method of the etchant, and other conditions are adjusted so as to set the etching rate for the lower electrode layer 10 comparatively low and to set etching time long. Thus, side etching of the dielectric layer 30 progresses even at an area covered with the mask R3, making it possible to make the diameter of the through hole 30b larger than the diameter φ3 of the opening of the mask R3. A part of the lower electrode layer 10 that overlaps the opening of the mask R3 is exposed to the etchant over a longer time period and thus becomes the center area A2 having a high surface roughness, while a part of the lower electrode layer 10 covered with the mask R3 is exposed to the enchant for a shorter time and thus becomes the annular area A1 having a low surface roughness.

Thus, by side-etching the dielectric layer 30, it is possible to form the annular area A1 and the center area A2 by way of a less number of processes.

Figure 12A:
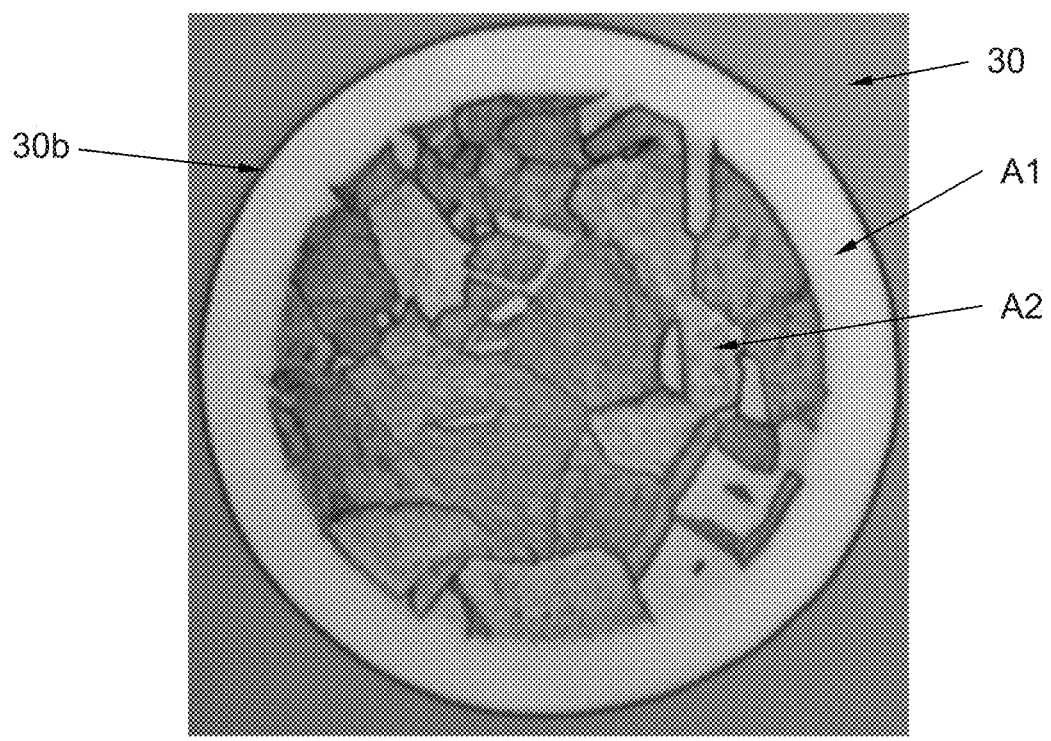
FIG. 12A is a photograph of a sample including the actually formed through hole 30b.
Figure 12B:
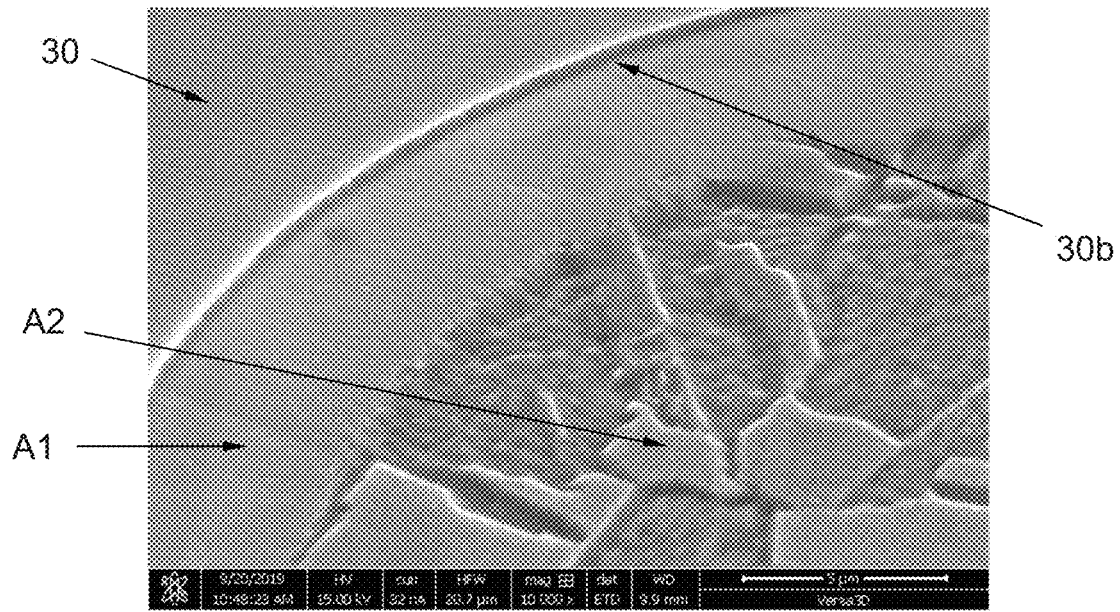
FIG. 12B is an enlarged view of the sample.

FIG. 12A is a photograph of a sample including the actually formed through hole 30b, and FIG. 12B is an enlarged view of the sample. As illustrated in FIGS. 12A and 12B, the annular area A1, which constitutes a part of the surface of the lower electrode layer 10 and is positioned along the inner wall surface of the through hole 30b, is clearly lower in surface roughness than the center area A2.

Figure 7:
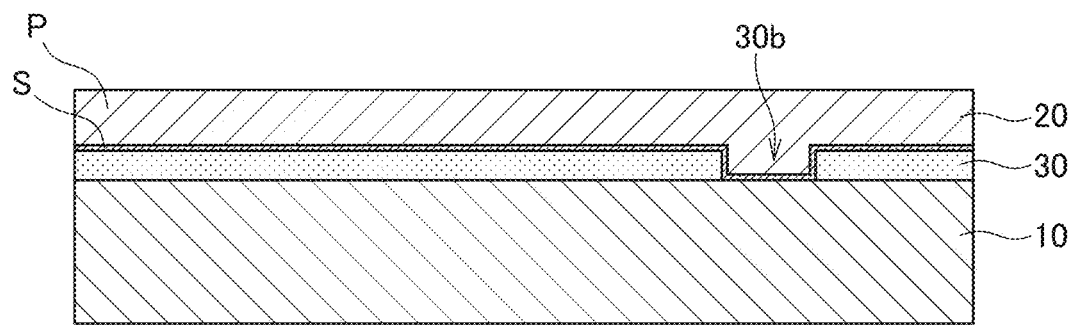

Then, as illustrated in FIG. 7, the upper electrode layer 20 is formed on the surface of the dielectric layer 30 including the through hole 30b. The upper electrode layer 20 can be obtained by forming the seed layer S in small thickness using sputtering or electroless plating and then by performing electrolytic plating using the seed layer S as a feeder. Thus, the upper electrode layer 20 composed of a laminated body of the thin seed layer S and thick electrolytic plating layer P is formed. Although the upper electrode layer 20 and the lower electrode layer 10 contact each other in the through hole 30b, sufficient adhesion is achieved between them since the surface of the lower electrode layer 10 has been roughened.

Figure 8:
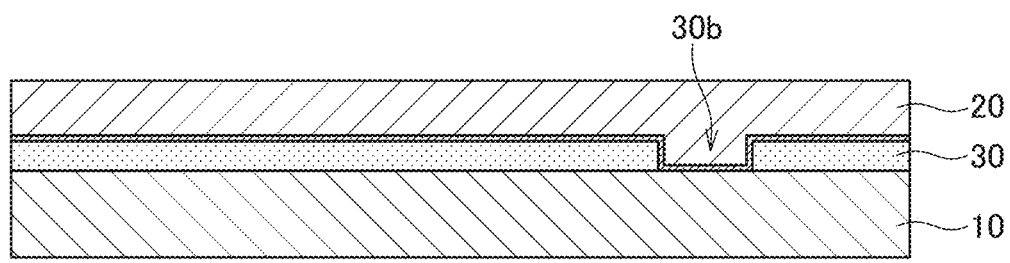

Then, the lower electrode layer 10 is reduced in thickness to about 10 μm as illustrated in FIG. 8, and the upper electrode layer 20 is patterned to form the slit SL as illustrated in FIG. 1. As a result, the electrode part 21 and the connection part 22 are insulated and isolated from each other by the slit SL, whereby the thin film capacitor 1 according to the present embodiment illustrated in FIG. 1 is completed.

As described above, in the present embodiment, wet-etching for forming the through hole 30b in the dielectric layer 30 is performed under the condition that the annular area A1, which constitutes a part of the surface of the lower electrode layer 10 that is exposed to the through hole 30b, is lower in surface roughness than the center area A2, so that it is possible to prevent cracks or peeling in the dielectric layer 30 which may occur at the mounting of the thin film capacitor 1 in the circuit board 2 while achieving sufficient adhesion between the lower electrode layer 10 and the upper electrode layer 20.

It is apparent that the present invention is not limited to the above embodiments, but may be modified and changed without departing from the scope and spirit of the invention.

What is claimed is:

1. A thin film capacitor comprising:
   a lower electrode layer;
   an upper electrode layer; and
   a dielectric layer disposed between the lower electrode layer and the upper electrode layer,
   wherein the dielectric layer has a through hole,
   wherein the upper electrode layer has a connection part connected to the lower electrode layer through the through hole and an electrode part insulated from the connection part by a slit,
   wherein a surface of the lower electrode layer that contacts the connection part through the through hole includes an annular area positioned along an inner wall surface of the through hole and a center area surrounded by the annular area, and
   wherein the annular area is lower in surface roughness than the center area.

2. The thin film capacitor as claimed in claim 1, wherein the surface roughness of the annular area is 0.1 nm or more and 3 nm or less, and the surface roughness of the center area is larger than 3 nm and 50 nm or less.

3. The thin film capacitor as claimed in claim 1, wherein a width of the annular area is 0.1 μm or more and 10 μm or less.

4. The thin film capacitor as claimed in claim 1, wherein the lower electrode layer comprises Ni.

5. A circuit board incorporating a thin film capacitor, the thin film capacitor comprising:
   a lower electrode layer;
   an upper electrode layer; and
   a dielectric layer disposed between the lower electrode layer and the upper electrode layer,
   wherein the dielectric layer has a through hole,
   wherein the upper electrode layer has a connection part connected to the lower electrode layer through the through hole and an electrode part insulated from the connection part by a slit,
   wherein a surface of the lower electrode layer that contacts the connection part through the through hole includes an annular area positioned along an inner wall surface of the through hole and a center area surrounded by the annular area, and
   wherein the annular area is lower in surface roughness than the center area.

6. A method of manufacturing a thin film capacitor, the method comprising:
   forming a dielectric layer on a surface of a lower electrode layer;
   forming a through hole in the dielectric layer;
   forming an upper electrode layer on a surface of the dielectric layer; and
   forming a slit in the upper electrode layer to form a connection part connected to the lower electrode layer through the through hole and an electrode part insulated from the connection part by the slit,
   wherein the forming the through hole is performed by wet-etching such that an annular part, which constitutes a part of the surface of the lower electrode layer that is exposed to the through hole and positioned along an inner wall surface of the through hole is lower in surface roughness than a center area surrounded by the annular area.

7. The method of manufacturing a thin film capacitor as claimed in claim 6, wherein the forming the through hole includes:
   wet-etching the dielectric layer through a first mask having a diameter smaller than a diameter of the through hole to expose the center area; and wet-etching the dielectric layer through a second mask having a diameter larger than that of the first mask to expose the annular area.

8. The method of manufacturing a thin film capacitor as claimed in claim 6, wherein the forming the through hole is performed by wet etching the dielectric layer through a mask having a diameter smaller than a diameter of the through hole to expose the center area overlapping an opening of the mask and the annular area covered with the mask.

\* \* \* \* \*